(12) United States Patent
Hofmann et al.

(10) Patent No.: US 6,741,079 B2
(45) Date of Patent: May 25, 2004

(54) NMR MICROSAMPLE HOLDER WHICH ALLOWS SAFE AND SIMPLE EXCHANGES OF THE SAMPLE TUBE

(75) Inventors: Martin Hofmann, Rheinstetten (DE); Ernst Ulrich Braumann, Durmersheim (DE)

(73) Assignee: Bruker Biospin GmbH, Rheinstetten (DE)

(*) Notice: Subject to any disclaimer, the term of this patent is extended or adjusted under 35 U.S.C. 154(b) by 0 days.

(21) Appl. No.: 10/161,746

(22) Filed: Jun. 5, 2002

(65) Prior Publication Data

US 2002/0196023 A1 Dec. 26, 2002

(30) Foreign Application Priority Data

Jun. 26, 2001 (DE) .......................... 101 30 283

(51) Int. Cl.[7] .................................. G01V 3/00
(52) U.S. Cl. ....................... 324/321; 324/318
(58) Field of Search .................. 324/321, 318

(56) References Cited

U.S. PATENT DOCUMENTS

| | | | | |
|---|---|---|---|---|
| 4,088,944 A | * | 5/1978 | Engler et al. | ............. 324/321 |
| 4,859,949 A | * | 8/1989 | McKenna | ................... 324/321 |
| 5,517,856 A | | 5/1996 | Hofmann | |
| 6,563,317 B2 | * | 5/2003 | Warden et al. | ............. 324/318 |
| 2002/0135372 A1 | * | 9/2002 | Warden et al. | ............. 324/321 |

FOREIGN PATENT DOCUMENTS

JP  8 184 659  7/1996

OTHER PUBLICATIONS

Catalog No. 851 (1985) cover page, copyright page, p. 27 and p. 28; Wilmad Glass Company Inc., New Jersey USA.*
"Patent Abstracts of Japan", Sect. E, vol. 3 (1979) No. 96 (E–130).
Catalog No. 851 (1985), pp. 28, 27 Wilmad Glass Company Inc., New Jersey.

* cited by examiner

*Primary Examiner*—Diego Gutierrez
*Assistant Examiner*—Tiffany A. Fetzner
(74) *Attorney, Agent, or Firm*—Paul Vincent

(57) ABSTRACT

The invention concerns an NMR sample holder for NMR samples with a short sample tube of constant diameter which is clamped in a largely gas-tight fashion and with a movable plunger and a rotor. The inventive device increases flexibility compared to conventional sample holders, reduces the vapor volume over the sample liquid in the sample tube and prevents deviations from precise orientation. The invention also concerns a method for simple and safe exchange of the sample tube thereby drastically minimizing loss through breakage.

24 Claims, 10 Drawing Sheets

NMR MICROSAMPLE HOLDER WHICH ALLOWS SAFE AND SIMPLE EXCHANGES OF THE SAMPLE TUBE

This application claims Paris Convention priority of DE 101 30 283.5 filed Jun. 26, 2001 the complete disclosure of which is hereby incorporated by reference.

BACKGROUND OF THE INVENTION

The invention concerns a sample holder for use in an NMR spectrometer with liquid microsamples, comprising a rotationally symmetric rotor with a central bore for receiving, centering and holding a hollow cylindrical sample tube of glass or quartz with one closed and one open end which can be temporarily closed and which has an outer diameter of 5 mm or less in the region of its closed end. The invention also concerns a method for filling such a sample holder.

Such a sample holder for microsamples, i.e. liquid samples in a range of less than one microliter to a maximum of several milliliters is conventional equipment for NMR spectrometers manufactured by Bruker BioSpin GmbH (see also U.S. Pat. No. 5,517,856). In conventional sample holders, a glass tube having an outer diameter of approximately 1.0 mm to 2.5 mm and drawn to a length of approximately 100 mm is used as sample tube. A liquid microsample is filled into this tube using i.a. a pipette or injection needle.

The filled tube is subsequently inserted into the central bore of a hollow screw having a clamping and a sealing surface, the screw having an inner diameter which is slightly larger than the outer diameter of the tube to thereby center the tube. Different screws are provided for the different tube diameters, the screws having identical outer dimensions but matched hollow bores. The tube is fixed by the screw in a 10 mm plunger and simultaneously sealed. The sample tube fixed in this fashion is subsequently introduced, together with the 10 mm plunger, into a so-called NMR rotor having a coaxial bore of 10 mm. The rotor primarily comprises coaxial cylinders having a common central bore but different outer diameters, the two cylinders being joined via a conical section. The rotor and the sample tube are lowered vertically from the top in opposition to a gas flow and into the room temperature bore of the cryostat containing the superconducting NMR spectrometer magnet such that the conical part of the rotor is either supported on a corresponding part of a stator disposed in the probe head of the spectrometer or, in response to a gas flow, rotates directly thereabove on a gas cushion about its axis which then coincides with the magnet axis. In this rotor position, the filled part of the sample tube is precisely in the central region of the magnet coil and is closely surrounded by a radio frequency coil for exciting and detecting NMR sample signals. The sample itself should have as elongated a cylindrical shape as possible with both of its ends projecting past the sensitivity region of the RF coil to prevent excessive disturbance on the homogeneity of the magnetic field by the intrinsic susceptibility of the sample. Moreover, it should fill as large a portion of the RF coil sensitive volume as possible in order to maximize the signal-to-noise ratio. For this reason, the above-mentioned sample holders have also been used for microsamples. Alternatively, 5 mm tubes having an end tapering to 2.5 mm have been used instead of a standard sample holder having a tube without tapering. They can also be used in automatic or semi-automatic spectrometer operation, i.e. with automatic sample changer, robot gripping arm and with lowering and ejection via computer-controlled gas flow. The materials used in the sample holder must, of course, meet certain criteria which are absolutely necessary for NMR spectrometer operation. They should have as small a magnetic susceptibility as possible to prevent disturbance of the field homogeneity in the measuring volume, have little electrical conductivity, or produce little dielectric RF losses and, depending on the type of nucleus examined, they must be free from compounds which could produce NMR disturbance signals, i.e. free from protons and $C^{13}$. Frequently used materials are glass, quartz, and Teflon®. Sample tubes of the above-mentioned type which are drawn to a thickness of 2.5 mm are described e.g. in the catalogue No. 851 (1985), page 28, of the Wilmad Glas Company Inc., New Jersey, USA and are distributed as type 520-1.

Sample tubes from glass with small, uniform cross-sections have also been used for microsamples having openings which are welded closed after filling-in the sample. These tubes have then been manually installed into the probe head of an NMR spectrometer and manually removed after the measurement. Automatic or reasonably user-friendly sample change was not possible.

Patents Abstracts of Japan, Sect. E, Vol. 3 (1979) No. 96 (E-130) discloses a sample holder for an NMR spectrometer having a sample tube of constant diameter which is inserted into the central bore of a rotor and is fixed by means of a pressure body pressed onto its open end. The lower end of a bent sample tube containing the sample is disposed on the axis by means of a guiding body and fixed through tightening a chuck, pressing the pressure body such that the sample tube remains fixed even after the guiding body is removed. This is intended to prevent the measuring sample from being outside of the NMR spectrometer measuring volume during the measurement, even when the sample tube is bent.

Other conventional techniques are also used outside the field of analytic spectrometers for e.g. clamping of round materials, e.g. in the heavy machinery industry, e.g. for clamping jaws of lathes or in other fields of application such as e.g. fixing lead pencil refills in writing instruments.

The above-mentioned sample holder for microsamples still has defects which were partly discussed above. The use of a screw for centering the sample tube inevitably transfers the coaxial asymmetry of the thread to the sample tube. Although optimization in production largely eliminates this defect it is, however, still present to some extent. Centering is fundamentally worse than with a central, precision bore. Spinning, i.e. rotating at high speed to improve the homogeneity was not possibly in many cases. Time-consuming shimming is then unavoidable in order to guarantee a sufficiently homogeneous field throughout the measuring region. Assembly and exchange of the sample tube is difficult since the entire plunger together with the mounted sample tube must always be removed from the spinner. The thin walls of the tubes used are very likely to break. For automatic filling of the sample tubes, it would be advantageous to use tubes shorter than the conventional 220 mm tubes having inner diameters in excess of 2.5 mm. Filling of 100 mm tubes is easier and produces less bubbles than in a 220 mm tube, in particular for the small inner diameters used for micro or milliliter tubes.

Disadvantageously, the probability that wall thicknesses in the narrowed region are not constant also increases with length. All these defects have a direct and very often fatal effect on the field homogeneity and therefore on the resolution of the spectrometer.

There is therefore a need for an NMR sample holder of the above-mentioned type which permits automatic spectrometer operation providing simpler and therefore safer and improved handling, and which is less susceptible to centering errors, wherein the amount of evaporated liquid sample is to be reduced e.g. compared to the conventional 5 mm sample tubes, as well as for a method for filling, releasing or fixing the sample tube of such a sample holder by which nearly no sample liquid is lost.

SUMMARY OF THE INVENTION

For a sample holder, this object is achieved by an NMR sample holder for liquid microsamples in an NMR spectrometer with the following components: 1) a rotationally symmetric rotor with a central bore; 2) a substantially cylindrical plunger with a thicker and a thinner region which can be inserted from one side into the central bore of the rotor and which is or can be connected therewith, wherein the plunger has a mounting means at its inserted end; 3) a hollow-cylindrical sample tube of glass or quartz with a closed and an open end which has a constant outer diameter of less than 11 mm across its entire length; 4) a clamp whose cylindrical part fits into the central bore of the rotor or into the central bore of the plunger guidance, comprising a central blind hole which is slightly larger than the outer diameter of the sample tube such that the sample tube can be inserted through the inner bore of the blind hole of the clamp and the outer cone of the clamp with spread fingers can be clamped in an inner cone, thereby centering the sample tube to hold it safely in this position; 5) a seal installed in the clamp which seals in a gas-tight fashion after insertion of the sample tube.

This device completely achieves the object of the invention.

The sample tube is much easier to manufacture. The tolerances in wall thickness deviations from axial alignment are considerably smaller than for a tube of more than twice the length. The inner volume of the tube is considerably smaller than that of conventional tubes in excess of 2.5 mm which reduces the gas space above the liquid sample to reduce sample evaporation. Less sample liquid is adsorbed on the smaller inner wall surfaces during filling. The use of a plunger permits use of shorter tubes which can be filled using a conventional injection needle which nearly reaches the closed end of the tube. Filling by an automatic robot is also considerably facilitated. The tube is centered through insertion into a blind hole in the clamp, mounted to the plunger. Since the insertion depth of the plunger can be varied within certain limits, axial adjustment is possible. The sealing problems are solved by a seal inserted in the plunger end. After clamping, the entire sample holder can be safely grasped at the plunger or rotor. It can be used without further modification in NMR spectrometers instead of standard sample holders for normal samples, even in fully-automatic operation. Suitable selection of the exchangeable clamp permits use of sample tubes of 5 mm to <1 mm with otherwise common construction. The same principle can also be used for tube diameters of >5 mm.

In an embodiment of the invention, the rotor and plunger guidance are made from a single piece, are glued or are rigidly joined in a different manner, wherein the central bore of the rotor merges into a shoulder bore thereof. The lower end of the rotor has a suitable widening for receiving the clamp.

This embodiment does not provide for fine axial adjustment of the sample tube, however represents a simple variation which lies within the scope of the invention.

In one embodiment of the invention, the clamp can be exchanged, preferably comprises several tongues and has a bore which is axial in the closed state and which is slightly smaller than the sample tube to be grasped.

This is advantageous in that only one structural part is required per tube diameter and the construction of all other parts remains the same irrespective of the NMR sample tubes used.

In a preferred embodiment of the invention, the seal has the shape of a small cylinder which is pressed onto the end of the centering bore. This seal should be produced from a relatively soft but chemically inert and solvent-resistant material, preferably Kalrez® or Teflon®.

In a preferred embodiment of the invention, the central part of the plunger has a thread which can be screwed to a mating thread of the clamp.

This permits connection of the plunger and the sample tube and insertion into the rotor as one piece. The plunger and sample tube can thereby be used as a conventional sample tube of large diameter. A rotor of slightly larger bore, e.g. 10 mm is usually used and is available as standard equipment.

In a preferred embodiment of the invention, the rotor has two substantially cylindrical axial regions with differing outer diameters which are connected by a conical region, wherein the plunger is inserted on the side having the larger outer diameter.

This has the advantage that the conical region inside of the NMR probe head can be supported on a correspondingly formed stator or can rotate, driven by gas, above same at a small separation therefrom. Rotors of this shape are conventional in spectrometers made by Bruker BioSpin GmbH.

In a further preferred embodiment of the invention, the central bore of the plunger guidance has, at its end facing the plunger, a conical widening within which the clamp holds the sample tube in the lifted state.

Advantageously, the sample is thereby reliably held and the sample tube is axially fixed in a predetermined, defined position.

In a further preferred embodiment of the invention, the outer plunger has a hollow bore in which the inner plunger is accurately guided and a conical widening into which the clamp, which is mounted to a plunger, is lifted by a non-magnetic spring to thereby hold the sample tube.

This is advantageous in that the sample tube can be installed and removed by simply applying pressure to the plunger end and without having to remove the insert.

In a further preferred embodiment of the invention, the central plunger can be moved to a limited degree for opening the clamp by simply applying pressure for releasing or receiving the sample tube during exchange thereof.

Advantageously, exchange is thereby safer and the sample tubes can be exchanged using one hand only.

In a further preferred embodiment of the invention, the sample tube has an axial length of between 80 mm and 120 mm.

This advantageously permits the tube to be easily filled with an injection needle while maintaining sufficient separation between the RF coil and the rotor or plunger to keep magnetic disturbances by these components small. Moreover, shorter sample tubes are better for automatic filling methods.

In a further preferred embodiment of the invention, the plunger has a total length of between 70 mm and 110 mm.

This advantageously provides for easy manual and automatic handling.

In a further preferred embodiment of the invention, the plunger has a diameter of between 6 mm and 10 mm, preferably 8 mm, in its region facing away from the conical opening.

This is advantageous in that it is easy to handle manually and automatically and corresponds to the standard dimensions of conventional sample tubes.

In a further preferred embodiment of the invention, the two cylindrical regions of the rotor have outer diameters of approximately 25 mm and 17 mm respectively.

This corresponds to the standard outer dimensions of conventional rotors.

In a further preferred embodiment of the invention, the sample tube has an inner diameter of approximately 0.5–4 mm.

For a conventional microsample amount of 5–400 µl, this produces a fill level of approximately 20 mm which is sufficient to protrude sufficiently beyond both ends of the axial sensitivity region of the RF coil that disturbances by the inherent susceptibility of the sample become uncritical.

In a further preferred embodiment of the invention, clamps are used having a blind hole with defined inner diameter in the range of approximately 1–5 mm.

This permits use of all conventional NMR tube diameters with the same device, wherein only the clamp must be matched.

In a further preferred embodiment of the invention, the rotor, plunger, seal and/or clamp are made from a plastic material with a small number of protons, preferably of Teflon® or KEL-F®.

This is advantageous in that the NMR measurement is minimally disturbed.

In a further preferred embodiment of the invention, the central bore of the rotor has a continuous diameter of approximately 10 mm.

Rotors of this type are available as standard for receiving sample tubes of large diameters.

In a further preferred embodiment of the invention, several clamps with different inner bores and identical, defined conical outer dimensions are provided.

This is advantageous in that plunger and rotor can be used for a plurality of microsample tubes of different thicknesses. Since the outer design is always the same for different inner bore diameters, different clamps can be installed into the same basic system thereby extending the field of application.

With respect to the method of filling one of the above-mentioned NMR sample holders for liquid microsamples, the object is achieved depending on the concrete embodiment of the NMR sample holder through one of the following two methods comprising the following steps:

1) a liquid microsample is filled into the sample tube up to a predetermined fill level;
2) the clamp with inserted seal is pushed over the sample tube;
3) the plunger is connected from above to the central bore of the rotor;
4) the sample tube is inserted from below into the blind hole of the clamp to a predetermined position; and
5) the thread of the clamp is screwed from below into a mating thread of the movable plunger in the rotor or in the plunger guidance;

or
1) a liquid microsample is filled into the sample tube to a predetermined fill level;
2) the clamp with fitted seal is pushed over the sample tube;
3) the sample tube is pushed from below into the blind hole of the clamp up to the stop;
4) and the plunger guidance with mounted plunger is inserted from above into the central rotor bore and can be axially adjusted via an adjustment screw.

With regard to a method for enabling some of the embodiments of the above-mentioned NMR sample holders of liquid microsamples, the object of the invention is achieved in that the helical spring is compressed through pressure on the upper plunger end and the fixedly mounted clamp is pushed out of the cone thereby losing its clamping properties.

With regard to a method for fixing the sample tube of some embodiments of the above-mentioned NMR sample holders of liquid microsamples, the object is achieved in that pressure reduction on the upper plunger end releases a helical spring and the fixedly mounted clamp is drawn into the cone thereby obtaining its clamping properties.

The object of the invention is completely achieved in each case.

The method permits reliable filling and gas-tight sealing of very small sample amounts, and sample tubes, plunger unit and rotor can be easily assembled into a sample holder which can be handled like a standard sample holder for larger liquid samples, in particular, even for fully automatic spectrometer operation. In advantageous further developments of the method, the plunger with plunger guidance, screwed to the sample tube via the clamp, can be used like a simple sample tube of a large diameter to thereby permit use of a non-modified rotor.

Further advantages of the invention can be extracted from the description and the enclosed drawing. The features mentioned above and below can be used in accordance with the invention either individually or collectively in any arbitrary combination. The embodiments mentioned are not to be understood as exhaustive enumeration but rather have exemplary character.

The invention is shown in the drawing and further described and explained with reference to concrete embodiments.

DESCRIPTION OF THE PREFERRED EMBODIMENT

Figure 1A:
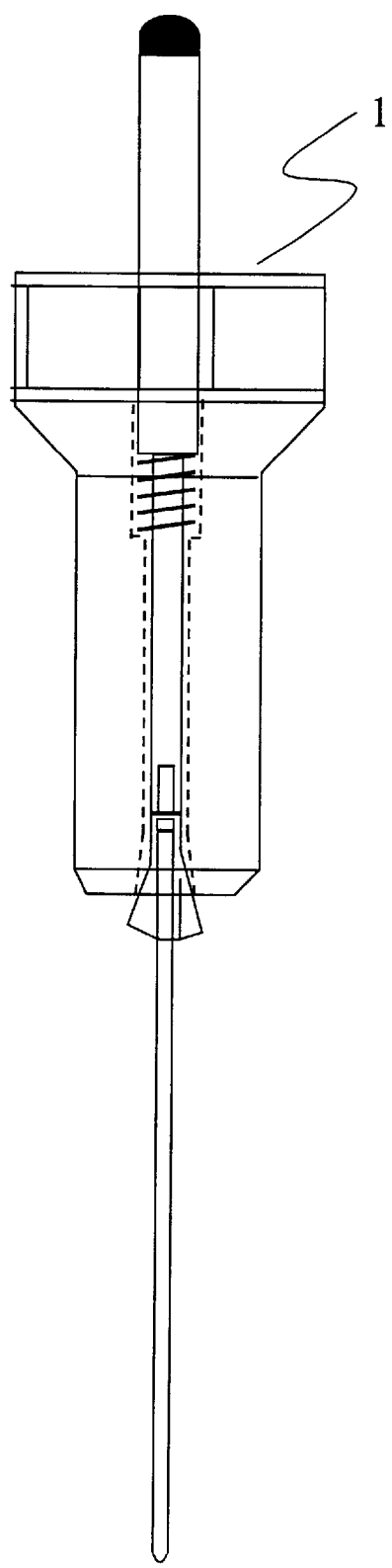
FIG. 1a shows an overall view of an embodiment of an inventive sample holder with clamped sample tube.
Figure 1B:
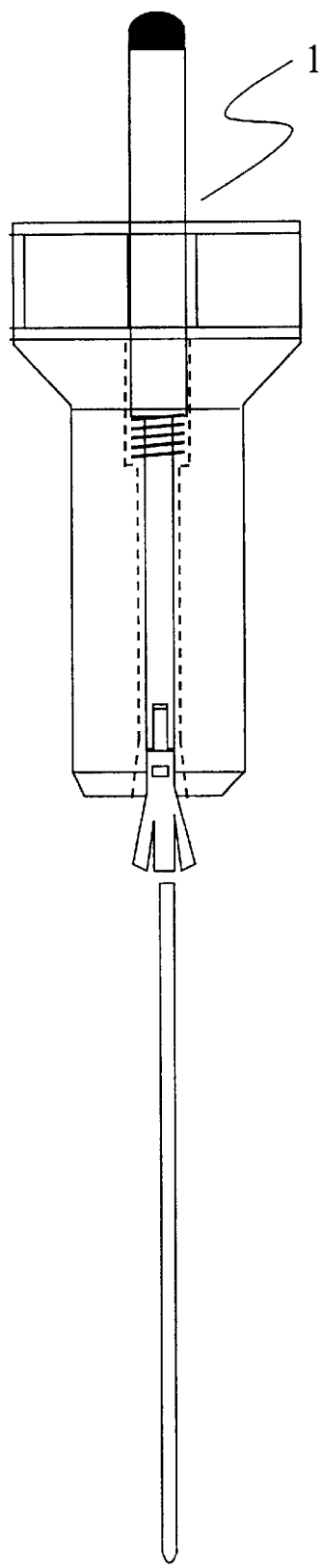
FIG. 1b shows an overall view of an embodiment of FIG. 1a with released sample tube.
Figure 1C:
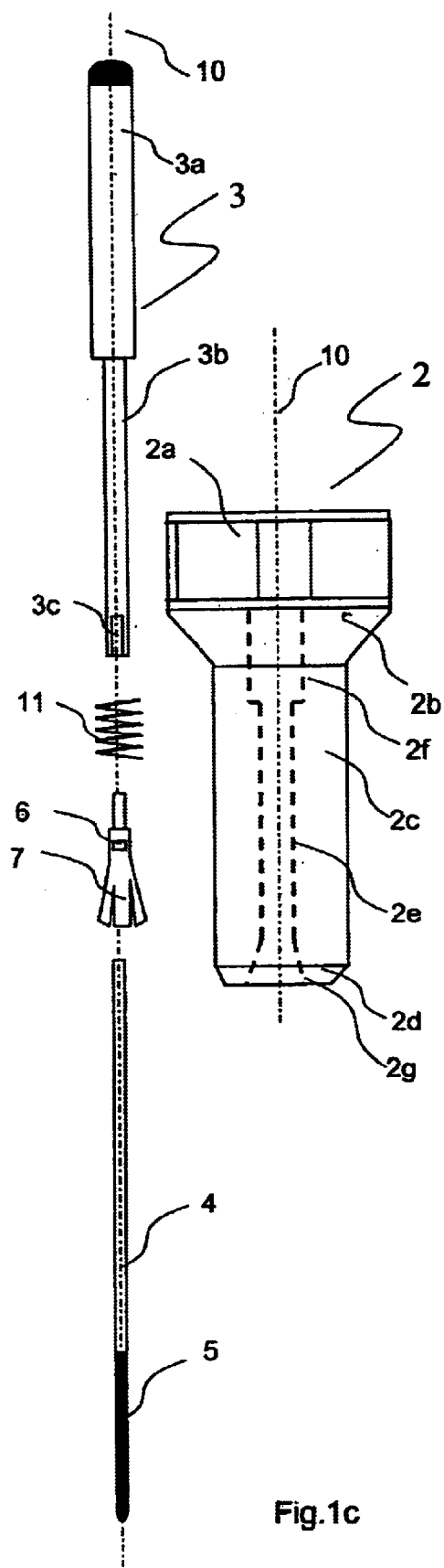
FIG. 1c shows a detailed view of the components of the embodiment of FIGS. 1a, 1b.

FIGS. 1a and 1b show, in detail, an embodiment of an inventive NMR sample holder 1 for NMR samples in the assembled state. FIG. 1a shows the NMR sample in the clamped state. In FIG. 1b, the tube can either be inserted or removed. FIG. 1c shows, in detail, the individual components of the embodiment.

A rotor 2 which is rotationally symmetrical about an axis 10 has a central inner bore 2e with a diameter of 5 mm which has a widening 2f, 2g at each end. The rotor 2 consists of a 10 mm long region 2a having a large outer diameter 26 mm which merges into a region 2b of 5 mm in length and then into a 27 mm long, cylindrical region 2c having a smaller outer diameter of 17 mm, which has a conical bevel 2d at its end of 3 mm in length. During operation, the vertical axis 10 of the rotor coincides with the likewise vertical symmetry axis of the room temperature bore of the cryostat of the NMR spectrometer which, in turn, lies on the symmetry axis of the superconducting magnet coil.

A non-magnetic helical spring 11 is inserted into the extended bore 2f of the rotor 2 which has a larger ID than the plunger region 3b. A substantially cylindrical plunger 3 or 3', having a total length of 100 mm, is inserted from above into the central bore 2e of the rotor 2. The region 3a or 3a' is 60 mm in length and substantially projects beyond the rotor 2. This region 3a or 3a' is 10 mm thick and preferably has, but must not have, a circular cross-section. It could also be hollow. Its diameter 3b or 3b' is reduced along an adjacent length of 40 mm and fits into the inner bore 2e. In differing embodiments, the rotor 2 and plunger guidance 102 can also be inserted or glued or can be made from a single piece. A conical end region 2g or 102g having a length of 10 mm adjoins the bore 2e or 102e and corresponds to the angle of the cone of a closed clamp 7 or 7'.

The clamp 7 or 7' is inserted from below into the rotor 2 and is rigidly connected to the downwardly pressed plunger 3 or 3'. The clamp 7 or 7' has substantially six functional regions (see also FIGS. 3a, 3b):

1. connect the thread 3c or 3c' around the clamp 7 or 7' to the plunger 3 or 3'.
2. receive and axially align an axially symmetrical blind hole 7b about the sample tube.
3. several spread clamping fingers 7c to permit insertion or removal of the sample tubes in the released state.
4. a cylindrical region 7d with axial and fitting outer diameter to guarantee axial guidance of the clamping bore.
5. a perpendicular edge 7e or 7e' to guarantee rigid connection with the plunger edge 3d or 3d' to cooperate with the axial guiding properties of the plunger region 3b or 3b'.
6. a seal 6 at the end of the blind hole of a relatively soft and chemically inert material to minimize or prevent evaporation of dissolved samples.

Screwing of the clamp 7 or 7' to the plunger 3 or 3' is a type of connection which is easy to realize. However, in particular with regard to the axial orientation, other types of connection, e.g. bayonet joint, are also feasible.

The open end of the sample tube 4 of a length of 100 mm and a constant outer diameter of approximately 1.6 mm is partially inserted into the blind hole 7b. The lower region of the inner volume of the sample tube 4 is filled with the sample liquid 5 along a length of approximately 20 mm.

An elastic seal 6 with an outer diameter which corresponds to the inner diameter of the blind hole 7b is pressed over the sample tube 4 to largely seal the tube.

When the pressure on the plunger 3 or 3' is released, it is pushed out of the rotor 2 through the upwardly acting force of the helical spring 11 until the clamp 7 or 7' seats in the lower cone 2g.

The upward pulling force closes the fingers 7c which then surround and hold an inserted tube.

If the tubes 4 used always have an exactly defined length, it is sufficient to push them to the end of the blind hole and to clamp them. The closed tube end then always has the same separation from the lower rotor end 2d to provide a reliable positioning within the NMR probe head.

Figure 2A:
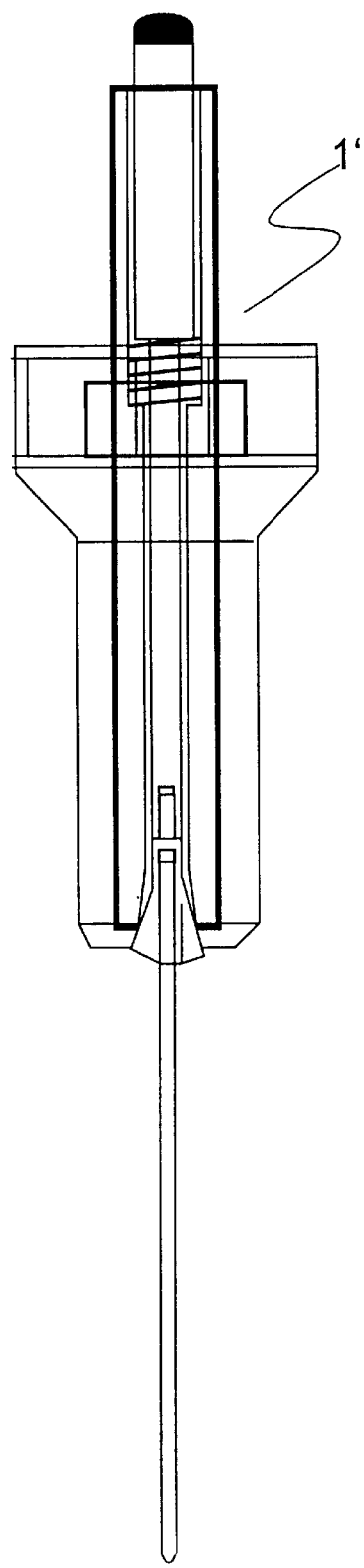
FIG. 2a shows an overall view of a further embodiment of an inventive sample holder with clamped sample tube.
Figure 2B:
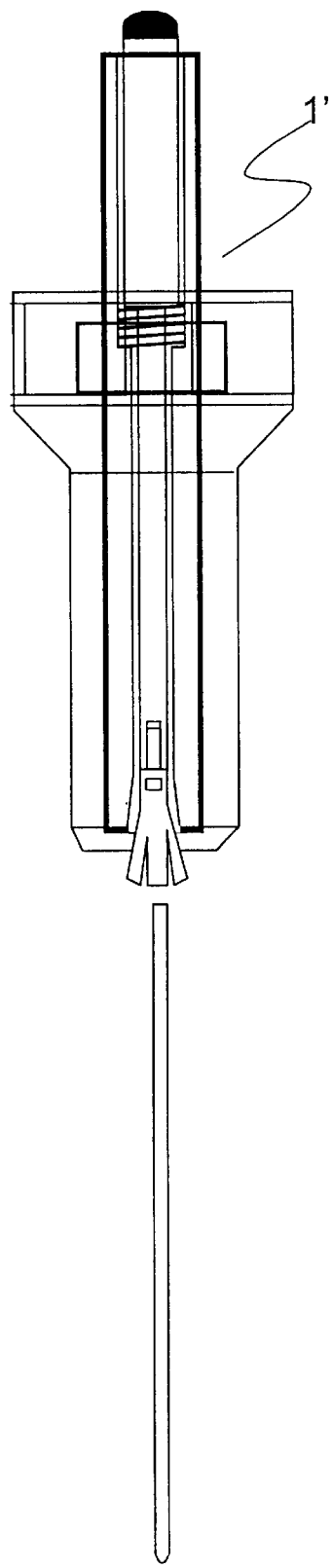
FIG. 2b shows an overall view of the embodiment of FIG. 2a with released sample tube.
Figure 2C:
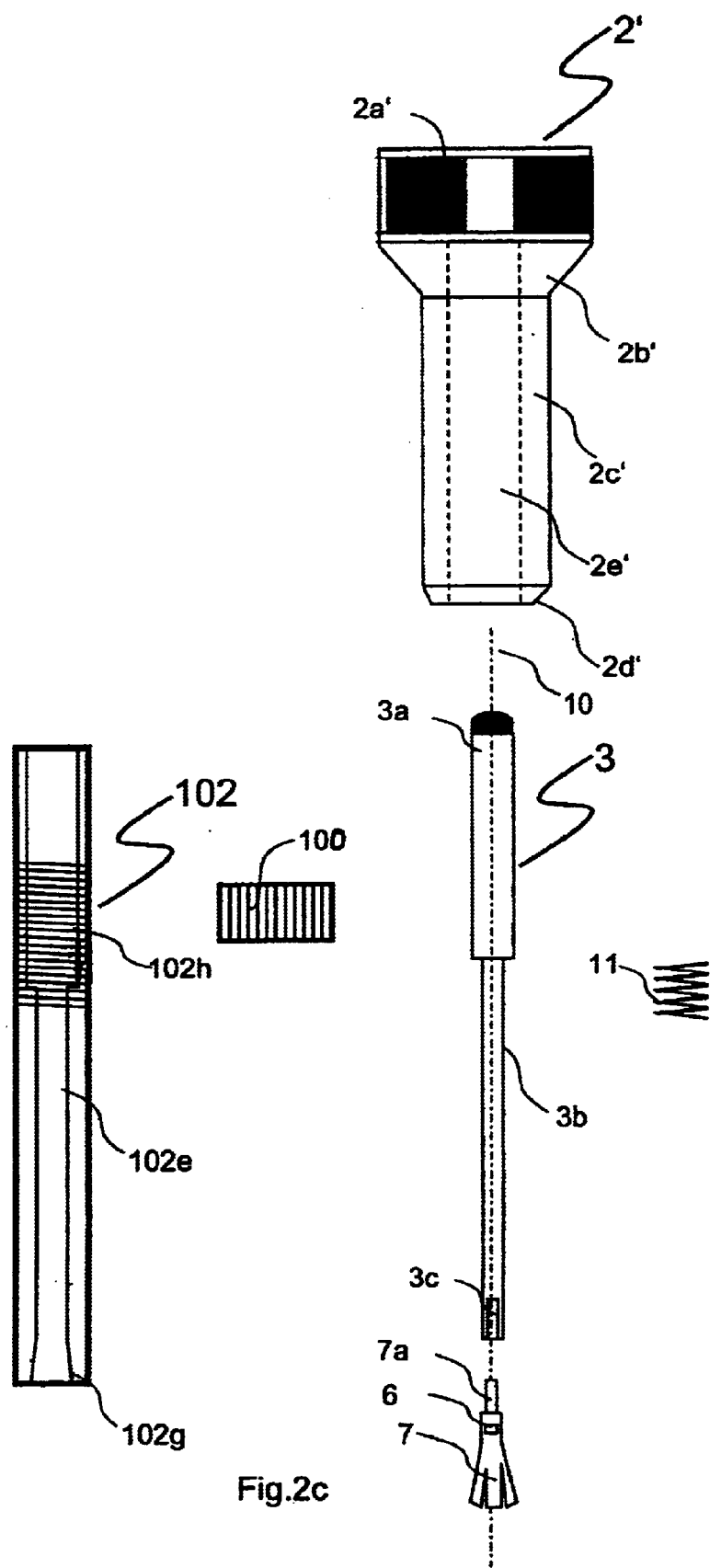
FIG. 2c shows a detailed view of the components of the embodiment of FIGS. 2a, 2b.

FIGS. 2a to 2c show the essential components of FIGS. 1a through 1c in a further embodiment. The reference numerals of corresponding parts are the same.

In contrast to the example of FIGS. 1a to 1c, the plunger insertion region 102 is separately introduced into a 10 mm standard NMR rotor 2'. It forms a separate axially movable region to permit fine adjustment of the samples. An adjustment nut 100 is screwed onto the plunger guidance 102 in the region 102h.

The mounting and function of the spring 11, the plunger 3 or 3' and of the clamp 7 or 7' are as described above.

The entire plunger guidance 102 with mounted individual parts is inserted from above into the rotor 2' until the adjustment nut is supported. After insertion of the sample tube 4, fine adjustment in the axial direction can be carried out using the adjustment nut 10. This turns out to be particularly advantageous if there is not enough sample amount 5 such that the small-volume sample must be precisely located within the NMR measuring region to prevent inhomogeneities.

If the length of the tubes 4 used is not always exactly defined, the closed end of the tube 4 can be always adjusted to the same separation from the lower rotor end 2d' by means of the adjustment nut 100 to provide reliable positioning within the NMR probe head.

Figure 3A:
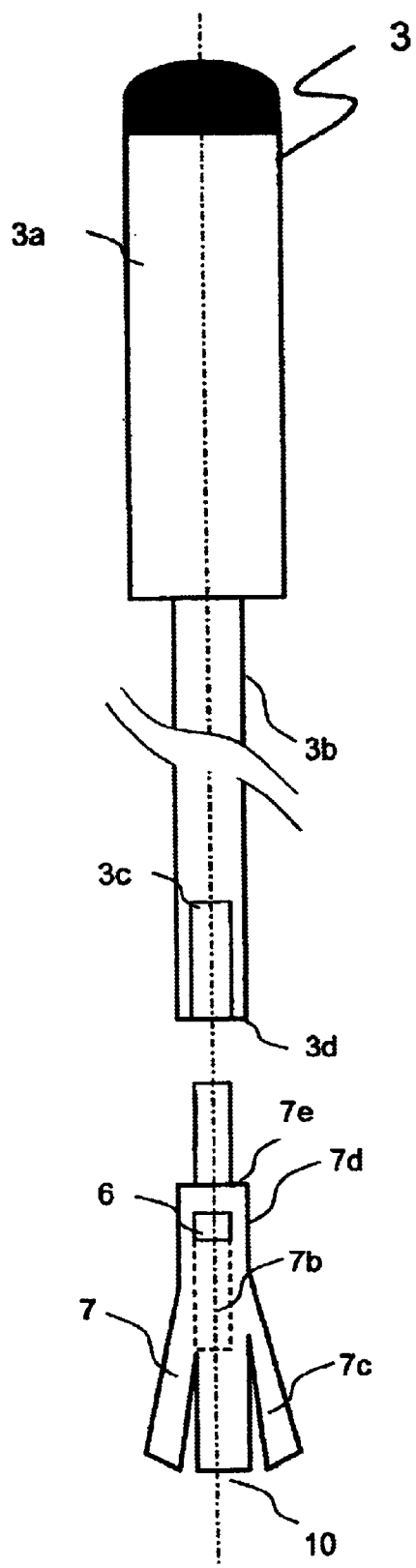
FIG. 3a shows a detailed view of plunger and clamp of an embodiment.
Figure 3B:
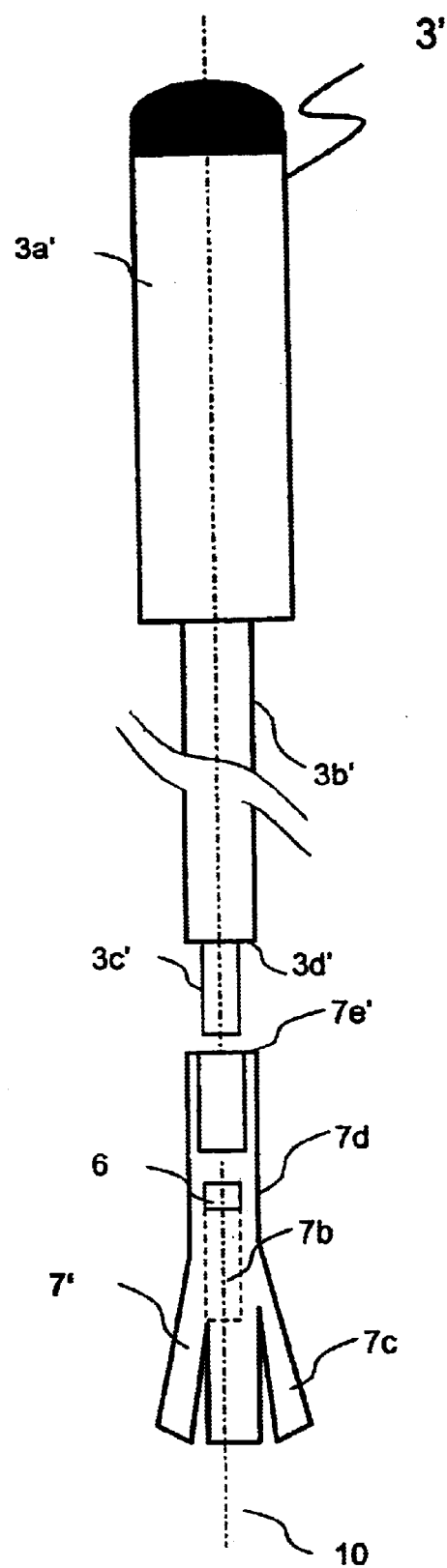
FIG. 3b shows a detailed view of plunger and clamp of a preferred embodiment.

FIG. 3a shows, in detail, the principal components of FIGS. 1c and 2c. The components of FIG. 3b provide a further preferred embodiment of the connection between plunger 3' and clamp 7'. Corresponding reference numerals can be extracted from FIG. 3a.

Figure 4A:
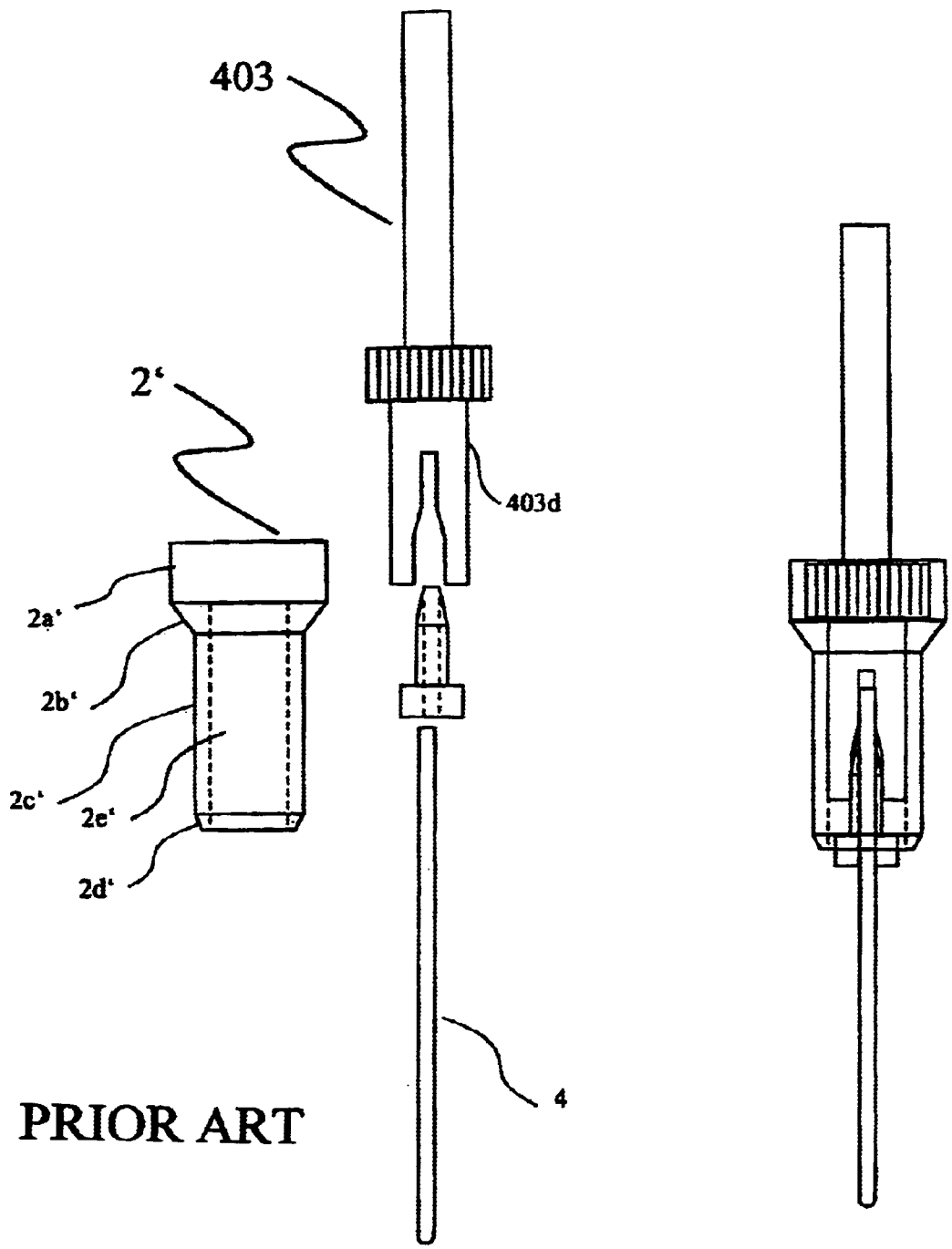
FIG. 4a shows a detailed and overall view of a microsample tube holder according to prior art.
Figure 4B:
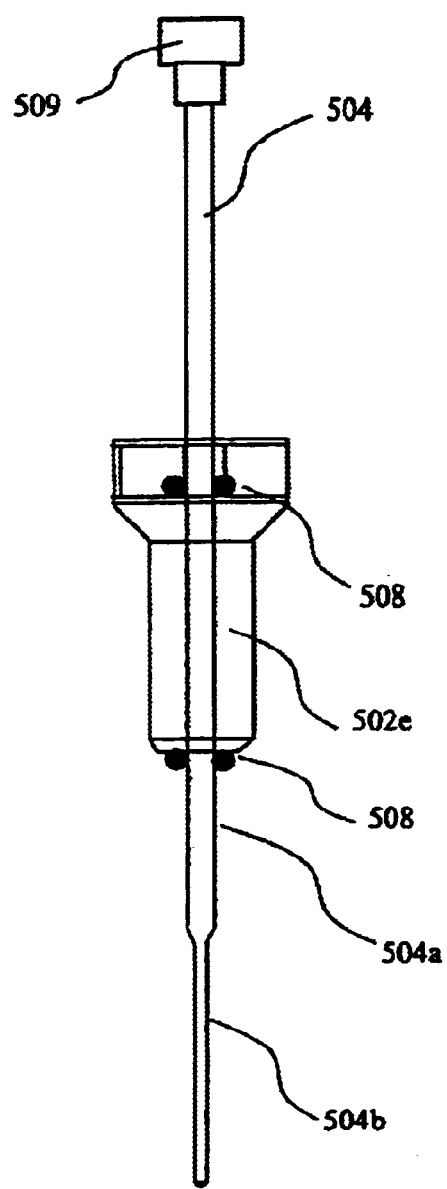
FIG. 4b shows an overall view of a standard sample holder with tapering sample tube according to prior art.

FIGS. 4a and 4b show NMR sample holders for microsamples according to prior art. The rotor 2' has the same outer dimensions as the rotor 2 of FIGS. 1c and 2c. The central bore 2e has a constant cross-section 2e which is slightly larger than the outer diameter of the lower part 403d of the insert 403. The sample tube 4 including insert 403 has approximately the total length of the sample tube 4 plus plunger 3 in FIGS. 1a and 1b and in FIGS. 2a and 2b, i.e. approximately 180 mm.

The same applies for the sample tube 504 of FIG. 4b. The diameter in the upper part 504a is approximately 5 mm. It tapers to 2.5 mm in the lower part 504b along a length of approximately 45 mm. The sample liquid fills part of this region 504b. A relatively large vapor-filled inner volume is located thereabove which can be closed at its open upper end with a plastic or rubber stopper 509. The sample tube 504 is held and axially adjusted by one or more surrounding O rings 508 which each compress a slotted axial extension of the rotor thereby locally reducing the bore 502e to the outer diameter of the tube 504a.

We claim:

1. An NMR spectrometer liquid microsample holder, the sample holder comprising:
   a rotationally symmetrical rotor having a central bore, said central bore having a conical end region;
   a substantially cylindrical, moveable plunger having a thicker and a thinner region, said thinner region being inserted into said central bore of said rotor, wherein said plunger comprises a mounting means at an inserted end of said thinner region;
   a clamp having a cylindrical part fitting into said central bore of said rotor, said clamp cooperating with said mounting means at a first clamp end thereof, said clamp having a central blind hole at a second clamp end thereof which is slightly larger than a constant outer diameter of a hollow cylindrical sample tube of glass or quartz having a closed and an open end, that accommodates liquid microsamples within the NMR spectrometer, with the sample tube having a constant outer diameter of less than 11 mm along an entire length thereof; said central blind hole accepting the sample tube, said clamp having an outer cone with spreading fingers structured for disposal within said conical end region of said central bore; and
   resilient means cooperating with said rotor and said plunger to urge said plunger in an upward direction relative to said rotor to press said spreading fingers, without substantial rotation thereof, against said conical end region of said central bore thereby centering and safely holding the sample tube.

2. The sample holder of claim 1, wherein said rotor comprises a plunger guidance defining said central bore.

3. The sample holder of claim 2, wherein said plunger guidance and said rotor are made from a single piece.

4. The sample holder of claim 1, wherein said clamp and said fingers are made from a single piece.

5. The sample holder of claim 1, further comprising a seal installed within said clamp to seal the open end of the sample tube in a gas-tight manner after insertion of the sample tube in said central blind hole, wherein said seal has a shape of an at least partially cylindrical disc and is inserted through said blind hole of said clamp to seat at an end of said blind hole for sealing the sample tube.

6. The sample holder of claim 1, wherein said central bore of said rotor has a widened inner diameter, said resilient means comprising a helical spring inserted within said widened inner diameter, wherein said thicker region of said plunger is inserted into said widened inner diameter to cooperate with said helical spring.

7. The sample holder of claim 2, wherein said rotor further defines an outer central bore having a parallel inner diameter of constant width into which said plunger guidance of said plunger can be inserted.

8. The sample holder of claim 1, wherein said rotor has two substantially cylindrical axial regions having different outer diameters which are connected via a conical region, said plunger being inserted on the side of an axial rotor region having a larger outer diameter.

9. The sample holder of claim 1, wherein the sample tube has an axial length between 80 mm and 120 mm.

10. The sample holder of claim 1, wherein said movable plunger has a total length between 90 mm and 130 mm.

11. The sample holder of claim 1, wherein said thicker region of said plunger has a diameter between 5 mm and 10 mm.

12. The sample holder of claim 11, wherein said thicker region of said plunger has a diameter of 8 mm.

13. The sample holder of claim 8, wherein said two cylindrical regions of said rotor have outer diameters of 25 mm and 17 mm respectively.

14. The sample holder of claim 1, wherein the sample tube has an inner diameter of approximately 1 mm to 5 mm.

15. The sample holder of claim 5, wherein at least one of said rotor, said plunger, said seal, and said clamp consist of plastic material containing a small amount of protons.

16. The sample holder of claim 15, wherein said plastic material is Teflon®.

17. The sample holder of claim 1, wherein said resilient means is made from non-magnetic material.

18. The sample holder of claim 1, wherein said central bore of said rotor has a largely continuous diameter of approximately 10 mm.

19. The sample holder of claim 1, further comprising a plurality of clamps having differing central blind holes each for accepting one of a plurality of sample tubes having matching, differing outer diameters.

20. The sample holder of claim 1, wherein said clamp has a conical outer shape with several spread fingers which, in a closed state, precisely fit into said conical end region of said central bore.

21. A method for filling the NMR sample holder for liquid microsamples of claim 1, the method comprising the steps of:
   a) filling a liquid microsample into the sample tube up to a predetermined fill level;
   b) pushing said clamp over said sample tube;
   c) inserting said plunger, from above, into said central bore of said rotor;
   d) inserting said sample tube, from below, into said blind hole of said clamp up to a predetermined position; and
   e) screwing a thread of said clamp, from below, into a mating thread of said movable plunger mounting means.

22. A method for filling the NMR sample holder for liquid microsamples of claim 2, the method comprising the steps of:
   a) filling a liquid microsample into the sample tube to a predetermined fill level;
   b) pushing said clamp over said sample tube;
   c) inserting said sample tube from below into said blind hole of said clamp up to a stop position thereof; and
   d) inserting said plunger guidance with a mounted said plunger, from above, into said central bore of said rotor;
   e) axially adjusting said plunger guidance using an adjustment screw.

23. A method for releasing the sample tube of the NMR sample holder for liquid microsamples of claim 1, wherein pressure is exerted onto an upper end of said plunger in opposition to said resilient means to push said clamp out of said conical end region and release its clamping properties.

24. A method for fixing the sample tube of the NMR sample holder for liquid microsamples of claim 1, wherein pressure exerted on an upper end of said plunger is reduced such that said resilient means urges said clamp into said conical end region to thereby obtain clamping properties.

* * * * *